US005264247A

United States Patent [19]

Lintula

[11] Patent Number: 5,264,247

[45] Date of Patent: Nov. 23, 1993

[54] PROCESS FOR THE MANUFACTURE OF A COATING BAR FOR A BAR COATER

[75] Inventor: Timo Lintula, Keuruu, Finland

[73] Assignee: Valmet Paper Machinery Inc., Finland

[21] Appl. No.: 697,075

[22] Filed: May 8, 1991

[30] Foreign Application Priority Data

Sep. 14, 1990 [FI] Finland ................................ 904541

[51] Int. Cl.[5] ........................ C23C 16/38; B05C 11/02

[52] U.S. Cl. ................................ 427/250; 427/255.4; 427/399; 29/527.2; 118/119; 118/414

[58] Field of Search ............... 118/119, 410, 414, 419, 118/262; 427/359, 191, 383.7, 436, 252, 250, 255.4, 399; 29/527.2

[56] References Cited

U.S. PATENT DOCUMENTS

| | | | |
|---|---|---|---|
| 2,729,192 | 1/1956 | Warner | 118/262 |
| 3,084,663 | 4/1963 | Warner | 118/119 |
| 4,348,980 | 9/1982 | Thevenot et al. | 148/279 |
| 4,637,837 | 1/1987 | von Matuschka et al. | 427/255.4 |
| 4,869,933 | 9/1989 | Sollinger et al. | 118/414 |

*Primary Examiner*—W. Gary Jones
*Assistant Examiner*—Steven P. Griffin
*Attorney, Agent, or Firm*—Steinberg & Raskin

[57] ABSTRACT

Process for the manufacture of a coating bar for a bar coater, wherein the coating bar is supported substantially over its entire length revolving in a cradle fixed to the frame of the coater. The coating bar is profiled and surface-treated by boronizing.

11 Claims, 4 Drawing Sheets

| | | |
|---|---|---|
| L | 500 - 12000 | mm |
| A | 0 - 500 | mm |
| d | 8 - 50 | mm |

BAR PROFILE

RANGES OF VARIATION OF PARAMETERS:

| | | |
|---|---|---|
| r1 | 0,05 - 0,250 | mm |
| r2 | 0,05 - 0,250 | mm |
| H1 | 0,05 - 0,250 | mm |
| H2 | 0,05 - 0,250 | mm |
| φ1 , φ2 | 70 - 150 | ° |
| D | 0,100 - 0,500 | mm |
| PITCH 0,200 ... 1,000 , THREAD WITH 1...7 STARTS | | |

PROCESS FOR THE MANUFACTURE OF A COATING BAR FOR A BAR COATER

FIELD OF THE INVENTION

The invention concerns a process for the manufacture of a coating bar for a bar coater, wherein the coating bar is supported substantially over its entire length as revolving in a cradle fixed to the frame of the coater.

The invention is further related to a coating bar for a bar coater, wherein the coating bar is supported substantially over its entire length as revolving in a cradle fixed to the frame of the coater.

BACKGROUND OF THE INVENTION

A bar coater is employed in coating of paper, particularly in cases where the possibility exists that the coating blade in a blade coater will produce streaks in the paper surface. In order to avoid this problem, attempts have been made to prevent such streaks using a coating bar. As a rule, the coating bar is rotated in the direction opposite to the direction of running of the web, at a rate of from about 10 to about 600 revolutions per minute. Coating bars are provided with suitable drive gears to rotate the bar, and in wide machines the bars are usually provided with drives at each end of the bar to avoid torsional vibrations.

When a bar coater is used, the coating process itself can be arranged, e.g., so that the coating agent is scraped off the web surface by means of the coating bar. A bar coater may also be constructed as a so-called short-dwell unit, wherein the coating agent is introduced into a coating-agent chamber. A coating agent chamber is defined by a front wall, the coating bar, and by the base to be coated itself, which base may be the face of a counter roll, the paper web, or equivalent.

The coating bar is mounted such that it is able to revolve in a cradle made of a suitable material, such as polyurethane. Normally, the bar is supported in the cradle over its entire length. A groove for water is usually provided in the cradle, in connection with the bar. The water circulates in the groove in order to lubricate, to cleanse and to cool the coating bar.

Traditionally, a hard-chromium plated wire bar has been used. For example, the bar doctor in the SYM-SIZER size press (trademark of Valmet Paper Machinery, Inc.), a size press used for surface sizing and coating of paper operated by the principle of short-dwell coating, has traditionally been a bar around which a stainless-steel wire has been wound. Hereupon the bar has been hard-chromium plated to improve its resistance to wear. The wound wire forms regular slots in the bar surface, by means of which slots the quantity of size to be applied to the roll face can be regulated. The size of the slots and, consequently, the quantity of size can be regulated by using different wire diameters.

Drawbacks of such a wire bar include short service life, tendency of the wire to be broken and thereby to enter into the nip, with resulting damage to the roll coating and a standstill. Further problems include poor wear resistance of the bar, as well as unsuitability of the bar for thermal and thermo-chemical coating processes, because the wire may be broken during the process. Further difficulties arise in the quality of the coating process, because the coating does not become uniform with long bars and does not adhere properly.

A bar doctor composed of ceramic bushings is also known in the art, by whose means attempts have been made to solve the above problem of wear resistance. The success of such attempts has been unsatisfactory in practice. Grooved bars having a hard-chromium plating on their surface have also been employed.

SUMMARY OF THE INVENTION

An object of the present invention is to provide a coating bar which does not have the drawbacks of the bars mentioned above and which has a higher resistance to wear.

These objectives and others are achieved by the present invention, which relates to a coating bar which is profiled and surface-treated by boronizing.

One aspect of the coating bar in accordance with the invention for a coater is that the coating bar is profiled and its surface layer contains a layer of ferrous boride ($FeB/Fe_2B$).

The concentration of boron in the layer of ferrous boride is preferably from about 2% to about 20%, preferably at least 8%, by weight. For example, a particularly preferred embodiment, the surface layer of the coating bar includes 16.23 percent by weight FeB compound and 8.83 percent by weight $Fe_2B$ compound.

The boronizing can be carried out either by means of a powder package process in the horizontal or vertical position, or by means of a paste process in a separate vacuum oven.

Boronizing by the powder package process utilizes boron carbide. The boron is diffused into the surface layer of the bar. This is accomplished, for example, by submerging in an oven preferably at a temperature from about 800° C. to about 1050° C.

The present invention is also related to a bar construction which is substituted for the above-described hard-chromium plated wire bar. In the invention, a smooth bar is provided with grooves by, for example, rolling. Thereafter, the bar is surface-treated by boronizing. The boronizing process itself is a well known surface treatment process based on diffusion, by whose means the composition of the surface layer on the steel is modified. In the surface layer, a hard layer of ferrous boride ($FeB/Fe_2B$) is formed by means of treatment at a high temperature, e.g. from about 800° C. to about 1050° C.

Because the surface-treatment process is based on diffusion, the grooves applied to the bar before the boronizing treatment do not cause problems. Consequently, a uniform hard and wear-resistant surface layer of a thickness of from about 5 microns to about 250 microns is obtained. In a preferred embodiment, the thickness of the surface layer is from about 15 microns to about 25 microns.

A wire bar cannot be boronized, because the wire would already be broken in the boronizing treatment. On the other hand, a grooved bar can be chromium-plated, but its resistance to wear is inferior to that of a boronized bar.

The hardness of a conventional hard-chromium plated bar is of an order of from about 700 to about 1100 HV units, whereas by means of a boronized bar in accordance with the invention, hardnesses of about 1100 to about 1700 HV are readily attained. Preferably, a hardness of about 1400 to about 1700 HV is achieved.

The reason for discarding a bar is either breaking of the wire or the fact that the size quantity no longer meets the requirements, as the profile becomes lower and the size volume is reduced. Typical service lives of bars with conventional hard-chromium coatings vary from a few hours to 3 or 4 weeks.

The rate of wear is usually approximately inversely proportional to hardness. The life of the boronized bar has greater hardness than a bar with a hard-chromium plated face. With the greater hardness of the boronized bar, a longer service life is obtained.

In general, the coater operates so that a regular volume remains between the bar and the roll. The volume has been provided either in accordance with the prior art e.g., by winding a wire around a 10 mm base bar, or in the manner suggested in the present invention, by forming a regular groove pattern onto a, e.g., 10 mm bar, of which there may be a number of different types.

By virtue of the combination of the invention, incorporating the prior-art surface treatment process (boronizing) with a grooved bar substituted for the prior-art wire bar, a service life is attained which is longer than with the prior-art solutions.

BRIEF DESCRIPTION OF THE DRAWINGS

In the following, the invention will be described by way of example with reference to the figures in the accompanying drawings.

DETAILED DESCRIPTION

Figure 1:
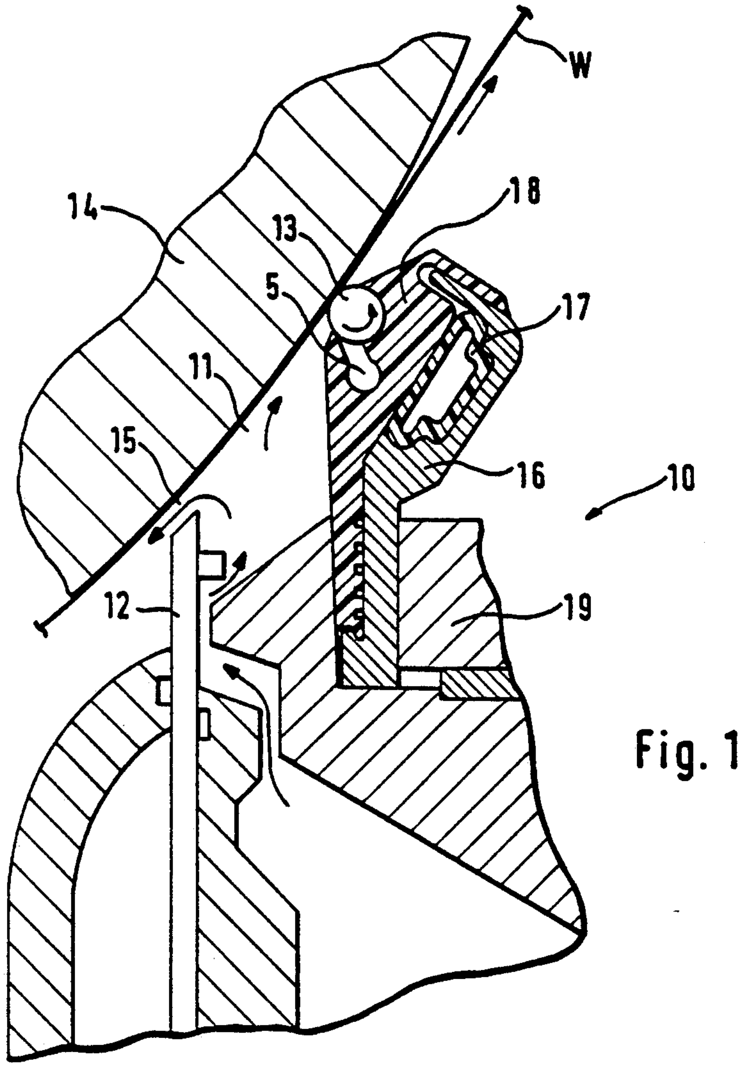
FIG. 1 is a schematic sectional side view of a bar coater in which a coating bar in accordance with the invention is employed.

FIG. 1 shows an exemplifying embodiment of a bar coater in which the bar in accordance with the invention can be applied. In FIG. 1, the coater is denoted generally with the reference numeral 10. The coater 10 is a bar coater, in which the coating bar 13 is in the embodiment shown in FIG. 1, fitted against the paper or board web W that runs on the face of a backup roll 14.

The coater 10 shown in FIG. 1 is a coater of the so-called short-dwell type, wherein the coating agent is introduced into a coating-agent chamber 11, which is placed before the coating bar 13 in the direction of running of the web W. The coating-agent chamber 11 being defined by said coating bar 13, by the web W, by the front wall 12 of the coating-agent chamber 11, and by lateral seals (not shown). The coating-agent chamber 11 is pressurized in any manner known in the art, and out of the chamber 11 an overflow of the coating agent is arranged through the gap 15 between the front wall of the coating-agent chamber and the web W.

The coating bar 13 is fitted in a cradle 18 made of a suitable material, e.g. of polyurethane. The cradle supports the coating bar 13 over its entire length. The coating bar 13 is provided with a purposeful drive gear, by whose means the coating bar 13 is rotated in the direction opposite to the direction of running of the web W. The cradle 18 of the coating bar 13 is fitted in a support 16, and both the cradle 18 and the support 16 are together fixed in a holder 19 mounted on the frame of the coater 10. Moreover, on the support 16, underneath the cradle 18, a loading hose 17 is provided, by whose means the coating bar 13 can be loaded in a desired manner against the web W. A water groove 5 is provided in cradle 18, which is placed in connection with the coating bar 13. The water circulating in the groove lubricates, cleanses and cools the coating bar 13.

Figure 2:
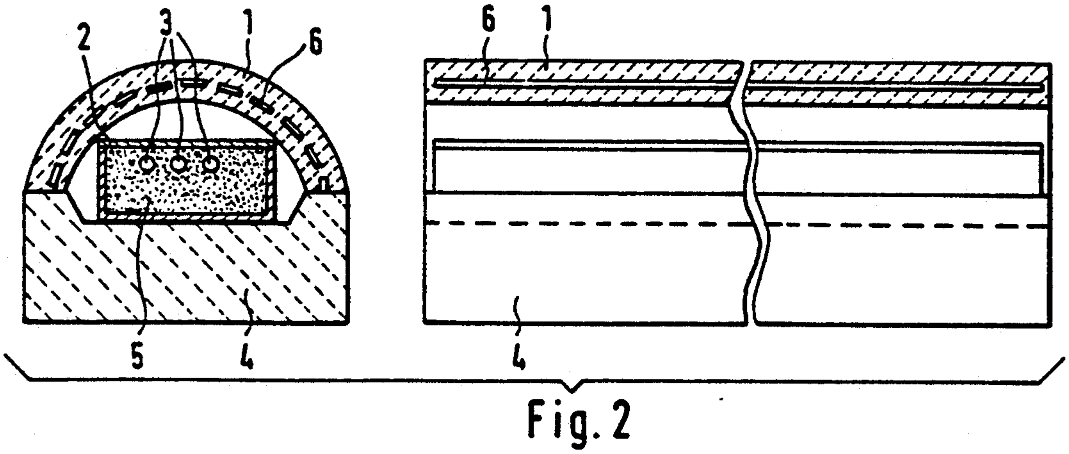
FIG. 2 shows an embodiment of boronizing in accordance with the invention wherein the boronizing is carried out by means of the powder packing process.

In the powder packing process illustrated in FIG. 2, in the horizontal position, the bars 3 are submerged in a vessel 2 made of stainless or fireproof steel. The vessel 2 contains activated boron carbide powder 5. Thereafter, the vessel is placed in an oven, which consists of a base 4 made of refractory bricks and of a cover 1. The cover 1 is made of fireproof ceramic fibre material, into which electric resistor units 6 have been embedded. The temperature of the resistor units 6 is regulated by means of a separate control unit. The temperature is raised by means of the resistor units to a temperature from about 800° C. to about 1050° C., at which temperature the diffusion of the boron into the steel takes place.

The particle size of the boronizing powder is in the range of from about 10 microns to about 1500 microns, depending on the groove size on the bar to be boronized, on the base material, and on the required surface quality. The reaction time varies from 10 minutes up to 30 hours, depending on the desired thickness of the hard layer. The type and the alloying of the base material also affect the reaction time.

The boronizing powder is available commercially, e.g., under the name EKabor, which is a registered trademark of Messrs. Elektroschmelzwerk Kempten GmbH. The boronizing powder consists of activated boron carbide, $B_4C$, whose boron concentration is from about 40 to about 70%. In this regard, reference is also made to *Boronizing* by Alfred Graf von Matuschka, Carl Hanser Verlag, Munich, Vienna, 1980, 97 p.

The powder packing process in the vertical position take place in a way similar to the horizontal processing, but therein the bars, the vessel, and the oven are placed vertically. In this case, it is possible to control the linearity of the bars more efficiently.

Figure 3:
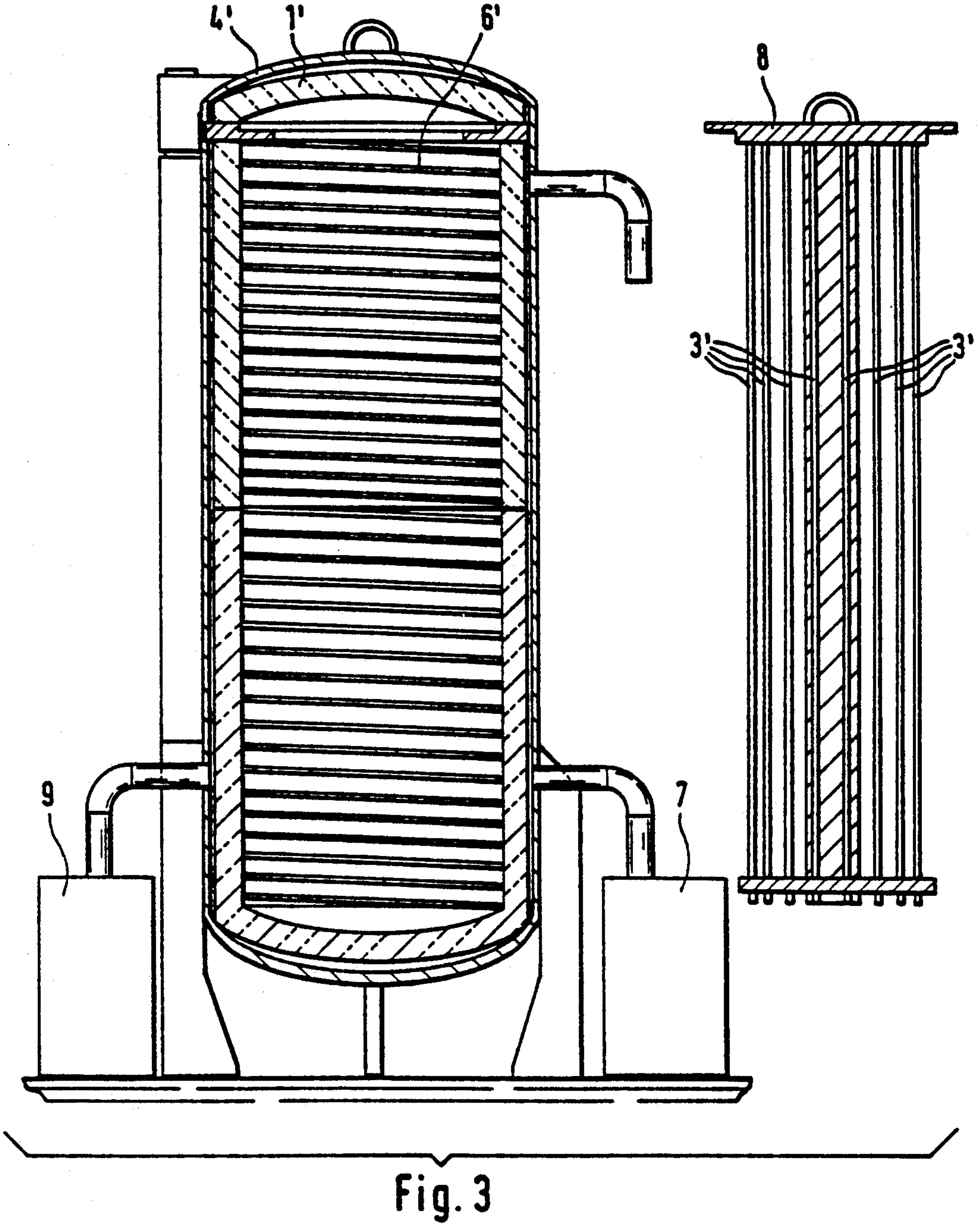
FIG. 3 shows an embodiment of boronizing in accordance with the invention wherein the boronizing is carried out by means of the paste process.

In the paste process illustrated in FIG. 3, a boronizing paste is spread onto the faces of the bars either by spreading, spraying, or by submerging the bars into a container filled with paste. Thereafter, the bars 3′ are placed vertically in a stand 8. The stand is placed into a shield-gas oven under vacuum, said oven consisting of a fireproof or stainless frame 4′ and of an insulation 1′ of fibre material, into which resistor units 6′ have been embedded. The required vacuum is sucked by means of a vacuum pump 7, and the shield-gas atmosphere is provided in the oven by means of nitrogen or argon 9. A shield-gas atmosphere is indispensable in the boronizing paste processing.

It is an advantage of the vertical treatments that the bars can be made to remain straight, because in the vertical position, owing to the bar's own weight, at a high temperature, a creep, i.e. a time-dependent deformation, takes place. The creep ($<0.01\%$ per 100 hours) produced as a result of the vertical treatment is so small that it does not affect the geometry of the bar profile Owing to the vertical position, the direction of the deformation is always the same, such that substantially no distortions arise. On the other hand, distortions arising from creep in the horizontal position are more probable, but in the horizontal processing they have been reduced by applying an axial force to the bar submerged in the powder during the boronizing treatment.

Boronizing paste also commercially available, e.g., under the registered trade mark Ekabor of said Messrs. Elektroschmelzwerk Kempthen GmbH. The boronizing paste is also a product based on boron carbide.

Figure 4:
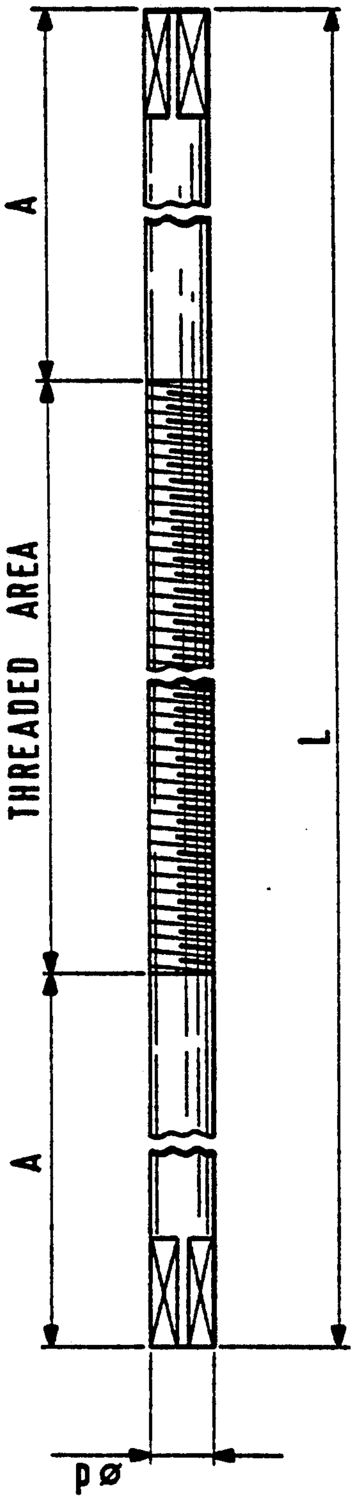
FIG. 4 is a schematic illustration of a coating bar in accordance with the invention.
Figure 5:
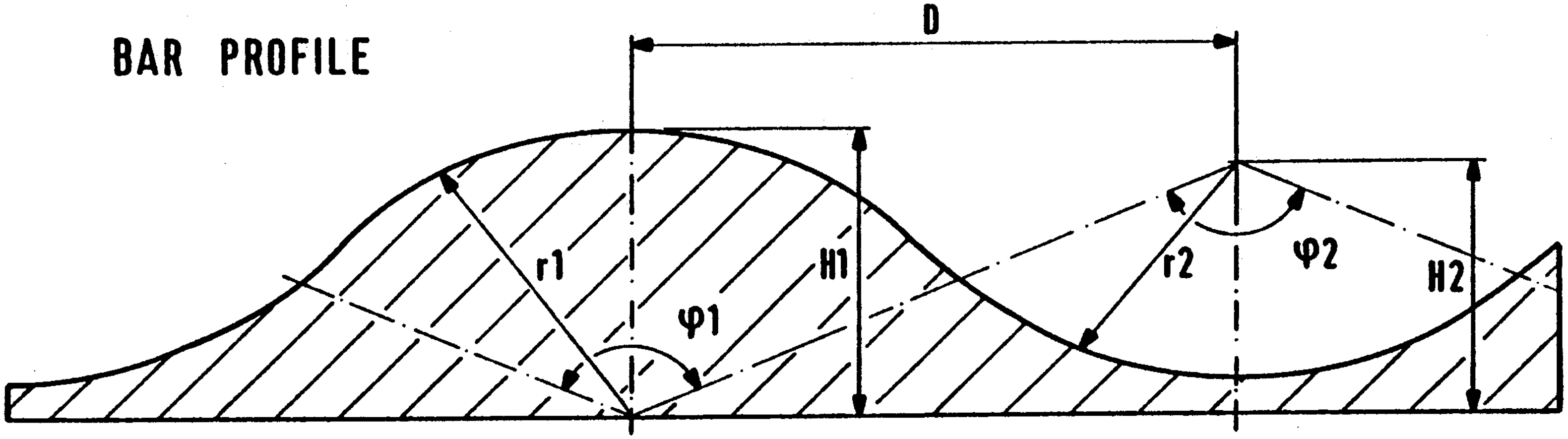
FIG. 5 is a schematic illustration of different profiles of a coating bar in accordance with the invention.

In FIG. 4, a preferred embodiment relating to the threaded area of a coating bar is shown. A detailed illustration of the thread profile is shown in FIG. 5. The groove pattern passes around the bar as spiral-shaped, having from about 1 to about 7 starts or no pitch. The pitch of the thread is understood as meaning the distance in the axial direction of the bar that corresponds to one revolution.

The thread profile passing around the bar can be defined by means of the parameters r1, r2, $\phi1$, $\phi2$, H1, H2, and D:

| | |
|---|---|
| $\phi1$ | area (angle) of effect of the radius of thread ridge |
| $\phi2$ | area (angle) of effect of the radius of thread valley |
| r1 | radius of ridge |
| r2 | radius of valley |
| H1 | height of ridge from the axial base line of the bar, determined by the radius r1 |
| H2 | depth of valley from the axial base line of the bar, determined by the radius r1 |
| D | distance in the axial direction of the bar equalling half a revolution. |

The bar doctor in accordance with the invention is grooved by molding, such as rolling or cutting, before the boronizing treatment based on diffusion, and after the shaping it has been boronized. The surface quality achieved on boronizing is so good that it does not require any major finishing. Owing to the smooth hard surface layer, the wear resistance is substantially higher than that of a conventional bar, and risks of operation, such as tendency of the wire to be broken, have been substantially eliminated.

The bar is rotated by the intermediate of a cardan shaft by a motor in a direction opposite to the sense of rotation of the roll. During operation, the bar contacts the roll coating, which may be abrasive. Moreover, the size to be applied contain abrasive particles, which wears off some of the profile of the bar in the course of time.

An advantage of the present invention over conventional coating bars include high hardness and wear resistance of the surface, because of which the service life is long, because the replacement of a bar causes no standstills. Another advantage of the present invention is that it provides evenness of the hard surface layer, as the process is based on diffusion. Another advantage is that it provides good adhesion of the hard surface layer, as the surface layer consists of the base material and there is no separate coating/base material interface.

Furthermore, breaks of wire have been eliminated, because there is no wire. However, a potential drawback is the quality (smoothness) of the surface, which is probably inferior to the smoothness of a hard-chromium plated surface.

The invention has been described by way of example with reference to the Figures in the accompanying drawing The invention is, however, not confined to the exemplifying embodiments shown in the figures alone, but a number of variations are possible within the scope of the inventive idea defined in the following patent claims.

What is claimed is:

1. A process for the manufacture of a coating bar for a bar coater, wherein the coating bar is supported substantially over its entire length and is adapted to revolve in a cradle fixed to a frame of the coater, comprising the steps of profiling the coating bar, providing a vessel with activated boron powder, contacting the coating bar with the activated boron powder in the vessel, and boronizing the coating bar by heating the activated boron powder in the vessel such that a surface layer of ferrous boride is formed on the coating bar.

2. The process of claim 1, wherein the heating step comprises heating the activated boron powder to a temperature from about 800° C. to about 1050° C.

3. The process of claim 2, further comprising the step of keeping the coating bar in the vessel from about 10 minutes to about 30 hours such that a desired thickness of the surface layer of ferrous boride is obtained.

4. The process of claim 1, further comprising the step of profiling the coating bar such that grooves are formed onto the coating bar.

5. The process of claim 4, wherein said grooves are formed by molding or by rolling.

6. The process of claim 4, further comprising the step of regulating the size of the grooves.

7. The process of claim 1, further comprising the step of submerging the coating bar in the vessel.

8. The process of claim 1, further comprising the steps of profiling the coating bar by rolling such that a rolling profile comprising grooves is formed in the coating bar and regulating the size of the grooves by modifying the rolling profile.

9. A process for the manufacture of a coating bar for a bar coater, comprising providing a spiral-shaped groove pattern on a coating bar contacting said grooved coating bar with a medium comprising activated boron powder, exposing said grooved coating bar to a temperature of from about 800° C. to about 1050° C. for a reaction time from about 10 minutes to about 30 hours, such that a desired layer of ferrous boride is produced on an outer surface of said coating bar.

10. The process of claim 9, further comprising the step of applying a paste contained activated boron powder onto said grooved coating bar.

11. The process of claim 9, wherein said coating bar is exposed in a vacuum.

* * * * *